(12) United States Patent
Greene et al.

(10) Patent No.: US 7,301,821 B1
(45) Date of Patent: Nov. 27, 2007

(54) VOLATILE DATA STORAGE IN A NON-VOLATILE MEMORY CELL ARRAY

(75) Inventors: Jonathan Greene, Palo Alto, CA (US); Robert M. Salter, III, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/251,074

(22) Filed: Oct. 13, 2005

(51) Int. Cl.
*G11C 16/04* (2006.01)

(52) U.S. Cl. ............................ 365/185.28; 365/185.01; 365/185.08; 365/185.18

(58) Field of Classification Search ........... 365/185.28, 365/185.01, 185.08, 185.18
See application file for complete search history.

(56) References Cited

U.S. PATENT DOCUMENTS

| | | | |
|---|---|---|---|
| 5,299,162 A * | 3/1994 | Kim et al. ............. | 365/185.17 |
| 5,640,344 A | 6/1997 | Pani et al. .................. | 365/182 |
| 5,740,106 A | 4/1998 | Nazarian .................. | 365/185.1 |
| 5,847,993 A | 12/1998 | Dejenfelt .................. | 365/185.1 |
| 6,076,138 A * | 6/2000 | Shin .......................... | 711/103 |
| 6,144,580 A | 11/2000 | Murray .................... | 365/185.1 |
| 6,282,121 B1 * | 8/2001 | Cho et al. ............. | 365/185.22 |
| 6,356,478 B1 | 3/2002 | McCollum ............... | 365/185.1 |
| 7,012,842 B2 * | 3/2006 | King ..................... | 365/189.09 |
| 7,110,308 B2 * | 9/2006 | Wang .................... | 365/189.11 |

* cited by examiner

*Primary Examiner*—Connie C. Yoha
(74) *Attorney, Agent, or Firm*—Sierra Patent Group, Ltd.

(57) ABSTRACT

A method for storing data on nodes in memory cells of a non-volatile memory cell array including steps of setting non-volatile devices of the non-volatile memory cell array to a desired state, biasing pull-up devices and non-volatile devices in a first set of rows of the non-volatile memory cell array to an off state, loading data onto column lines of the non-volatile memory cell array and biasing non-volatile devices in a second set of rows in the memory cells of the non-volatile memory cell array to store data from the column lines on the nodes in the memory cells of the non-volatile memory cell array.

27 Claims, 8 Drawing Sheets

FIG. 1A

| Mode | VSP(v) | CL(v) | RH(v) | RL(v) | P-well(v) | N-well(v) |
|---|---|---|---|---|---|---|
| OPERATE | 2.5 | 0 | 2.2 | 0.8 | 0 | 2.5 |
| ERASE | 3 | 3 | 0 | -15 | 3 | 3 |
| WRITE | 3 | -3 | 0 | 12 | -3 | 3 |
| READ Vt | 2.5 | Light load to -1v test Vtrip=0 | 1.5 | <0 | -1 | 2.5 |
| READ LEAKAGE | Force Imax Leak, Vtrip = app 2.5v | 0 | 1.5 | >0 | 0 | 0 |

| Mode | VSP(v) | CL(v) | RH(v) | RL(v) | P-well(v) | N-well(v) |
|---|---|---|---|---|---|---|
| OPERATE | 2.5 | 0 | 2.2 | 0.8 | 0 | 2.5 |
| ERASE HHI | 5 to 6 | 5 to 6 | 0 | -10 to -12 | 0 | 3 |
| ERASE F-N | 0 or float | 0 or float | 0 | -10 to -12 | 0 | 3 |
| WRITE HHI | 0 | 4 to 5 | 0 | 8 to 9 | 0 | 3 |
| WRITE F-N | 6 to 7 | 6 to 7 or Float | 0 | 12 to 14 | 0 | 3 |
| READ Vt | 1 to 2 | 0 | 0 | 3 to 4 | 0 | 3 |
| READ LEAKAGE | | | | | | |

VOLATILE DATA STORAGE IN A NON-VOLATILE MEMORY CELL ARRAY

BACKGROUND OF THE INVENTION

1. Field of the Invention

The present invention relates to testing of nonvolatile, reprogrammable logic devices (PLDs). More particularly, the present invention relates to storing volatile data in a non-volatile cell array memory in a PLD.

2. The Background Art

PLDs are integrated circuit devices which contain gates or other general-purpose cells whose interconnections can be configured by programming to implement nearly any desired combinatorial or sequential function. FPGAs are well known in the PLD art. FPGAs generally include an array of general-purpose logic circuits, typically referred to as logic blocks, which can be programmed by programmable elements to implement virtually any logic function. The programmed logic elements in the gate array are connected together by routing resources to form a desired integrated circuit. The routing resources are connected to each other and to the logic elements in the gate array by programmable elements.

It is well known in the art that both volatile and non-volatile reprogrammable elements have been used to provide interconnection in FPGA devices. Volatile programmable elements are often a pass transistor controlled by a static random access memory (SRAM) cell. Reprogrammable SRAM based architectures are well known in the FPGA art. In an SRAM based reprogrammable FPGA, the programmable elements are typically passgates controlled by information stored in an SRAM configuration memory.

There are a variety of non-volatile reprogrammable memory devices known to those of ordinary skill in the art. These include floating gate transistors, and local charge storage MOS transistors such as floating trap MOS transistors, including SONOS or MONOS devices, and floating gate silicon nanocrystal MOS transistors. In known non-volatile memory based FPGAs, there are numerous examples of non-volatile memory cells that employ, either alone or in some arrangement, these non-volatile reprogrammable memory devices.

A floating gate transistor is an MOS based device having an unconnected or floating polysilicon layer disposed in a dielectric between the semiconductor surface and the gate of the MOS transistor. While there are a variety of known floating gate transistor technologies, in a floating gate transistor based FPGA, the floating gates are typically similar to those used in flash memories the operation of which is well known to those of ordinary skill in the art, but adapted for use in programmable arrays. Proposed floating gate transistor memory elements employed in programmable logic devices include electrically programmable read only memory (EPROM), electrically erasable and programmable read only memory (EEPROM), flash EEPROM, NOR flash and NAND flash.

To program the floating gate transistor, electrons are placed on the floating polysilicon layer, and to erase the floating gate memory cell, electrons are removed from the floating polysilicon layer. According to the particular floating gate transistor technology involved, electrons are placed onto the floating gate and removed from the floating gate by a combination of channel hot electron injection or Fowler-Nordheim tunneling and UV light, hot hole injection or Fowler-Nordheim tunneling, respectively. Each of these methods for placing and removing electrons on the floating require the gate, source, drain and substrate of the floating gate transistor to either be biased to voltages relative to one another or to float for a time sufficient to either program or erase the floating gate transistor.

As is well known in the art, a floating gate memory cell is programmed when sufficient electrons are placed on the floating polysilicon layer to prevent the MOS transistor of the floating gate memory cell from being turned on. The charged floating polysilicon layer opposes a voltage which, when applied to the gate of the floating gate memory cell would typically turn-on the MOS transistor of the floating gate memory cell. When these electrons are removed, a normal operating voltage applied to the gate of floating gate transistor will result in current flowing through the MOS transistor of the floating gate memory cell. It well known by and within the skill of those of ordinary skill in the art that the voltages required to program and operate a particular implementation of a floating gate transistor depend upon the particular geometries of the floating gate transistor employed. During a read operation, this current may then be sensed to determine whether a particular floating gate memory cell has been programmed.

In an n-channel floating gate silicon nanocrystal MOS transistor, a p-type region formed by a p-type semiconductor substrate or p-type well formed in a semiconductor substrate has a first n-type source/drain (S/D) region and a second n-channel source/drain region, and a lower silicon dioxide layer of typically about 20 to about 60 angstroms in thickness is disposed above the p-type region and a portion of the source and drain regions and, respectively, in a manner of forming an MOS transistor as is well known to those of ordinary skill in the art.

A layer of silicon nanocrystals typically having diameters of typically about 40 angstroms to about 100 angstroms and spaced apart by about 40 angstroms to about 60 angstroms is disposed above the lower silicon dioxide layer. The silicon nanocrystal layer forms a floating gate that traps charge as it is injected across the oxide layer and into the silicon nanocrystal layer. An upper layer of silicon dioxide of about 60 angstroms is formed over the silicon nanocrystal layer. A polysilicon or metal conductive control gate is disposed above the upper oxide layer. The upper oxide layer electrically isolates the conductive control gate from floating gate formed by the silicon nanocrystal layer.

In a floating gate silicon nanocrystal MOS transistor, charge is stored (trapped) in or removed from after being trapped in the silicon nanocrystals. Unlike a conventional floating gate transistor, where charge stored on the polysilicon conductor may flow freely in the polysilicon conductor, charge stored in a floating gate silicon nanocrystal MOS transistor is localized to the region of the floating nanocrystal material above the source or drain where it was originally placed during programming. Accordingly, a bit of information may be stored above each of the junctions of a nanocrystal based MOS transistor for a total of two bits. This two-bit charge storage is analogous to the two-bit charge storage provided by a floating trap MOS transistor such as SONOS or MONOS. To program a floating gate silicon nanocrystal MOS transistor device both channel hot electron injection and Fowler-Nordheim tunneling have been employed. To erase a floating trap MOS transistor device both Fowler-Nordheim tunneling and tunneling enhanced hot hole injection have been employed.

After an FPGA has been manufactured, the routing resources and logic resources must be tested to establish the correct function and reliability of the part. For instance, tests must establish the absence of undesired shorts or opens among the routing tracks and correct functioning of the logic, switches, and buffers. Presently, one known method of testing the FPGA is to identify, program, and verify some sufficient number of designs carefully chosen for this purpose. Each design is programmed into the FPGA and test vectors are then applied to the design to determine whether the various elements of the design are properly connected and functioning. This process is then repeated for each of the selected number of designs to be tested.

The time required to reprogram the non-volatile FGPA for each test design can be considerable, and may represent a significant portion of the cost of the tested integrated circuit die. In some instances, depending on the particular non-volatile memory cell, the amount of programming time required can be reduced with techniques such as the simultaneous writing of many bits. This is not always feasible, or may still not achieve an acceptable reduction. As a consequence, it would be desirable to find techniques for testing a non-volatile FGPA that reduce the number of times the non-volatile configuration memory must be programmed.

Techniques that allow multiple designs to be configured in a volatile fashion without completely reprogramming the non-volatile configuration memory would also be useful for other purposes, including rapid prototyping and dynamic reconfiguration a portion of a design during normal operation of the FPGA.

BRIEF DESCRIPTION OF THE INVENTION

According to a first aspect of the present invention, a method for storing data on nodes in memory cells of a non-volatile memory cell array includes the steps of setting non-volatile devices of the non-volatile memory cell array to a desired state, biasing pull-up devices and non-volatile devices in a first set of selected rows of the non-volatile memory cell array to an off state, loading data onto column lines of the non-volatile memory cell array, and biasing non-volatile devices in a second set of selected rows to store data from said column lines on the nodes in memory cells of the non-volatile memory cell array.

According to a second aspect of the present invention, a method for storing data on nodes in memory cells of a non-volatile memory cell array includes the steps of setting non-volatile devices of the non-volatile memory cell array to a desired state, biasing pull-up devices and non-volatile devices in a first set of selected rows of the non-volatile memory cell array to an off state, loading data onto column lines of the non-volatile memory cell array, and biasing pull-up devices and non-volatile devices in a second set of selected rows to store data from said column lines on the nodes in memory cells of the non-volatile memory cell array.

According to a third aspect of the present invention, a method for storing volatile data on nodes in memory cells of a non-volatile memory cell array includes biasing pull-up devices and non-volatile devices in a first set of selected rows of the non-volatile memory cell array to an off state, loading data onto row lines of the non-volatile memory cell array, and biasing pull-up devices in a second set of selected rows to store data from said row lines on the nodes in memory cells of the non-volatile memory cell array.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Generally, in a non-volatile, reprogrammable FPGA architecture suitable for use according to the present invention, there is included an array of programmable logic blocks, routing resources for connecting the programmable logic blocks together, an array of routing switch memory cells whose contents are employed to connect the routing resources together, and static configuration memory cells for programming the logic devices.

Figure 1A:
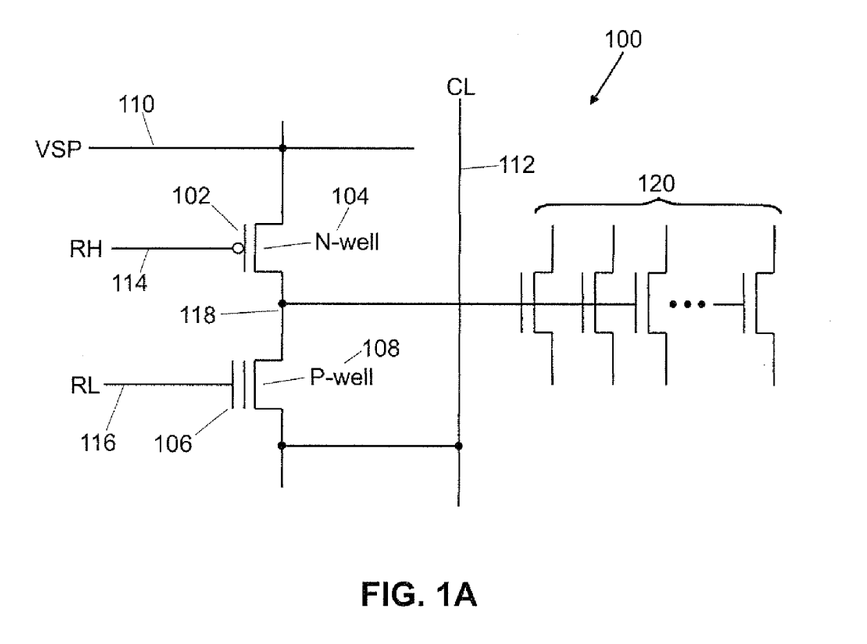
FIG. 1A is a schematic diagram of a first embodiment of non-volatile memory cell suitable for use according to the present invention.

In FIG. 1A, a first embodiment of a non-volatile memory cell 100 suitable for use according to the present invention is illustrated schematically. The memory cell 100 includes a pull-up device and a non-volatile pull-down device connected in a push-pull arrangement. The pull-up device in memory cell 100 is a p-channel MOS transistor 102, disposed in an N-well 104, and the non-volatile pull-down device in memory cell 100 is a floating gate transistor 106, disposed in a P-well 108.

In non-volatile memory cell 100, the source of p-channel MOS transistor 102 is electrically coupled to a first column line (CL1) 110, and the source of floating gate transistor 106 is electrically coupled to a second column line (CL2) 112. The gates of p-channel MOS transistor 102 and floating gate transistor 106 are electrically coupled to first and second row lines (RH and RL) 114 and 116, respectively. The drain of p-channel MOS transistor 102 is electrically coupled to the drain of floating gate transistor 106 to form a common node 118. A switch element in non-volatile memory cell 100, depicted as n-channel MOS transistor 120 has a gate coupled to common node 118. The output at common node 118 may otherwise be employed to drive a static device that programs the logic in the FPGA.

Figure 1B:
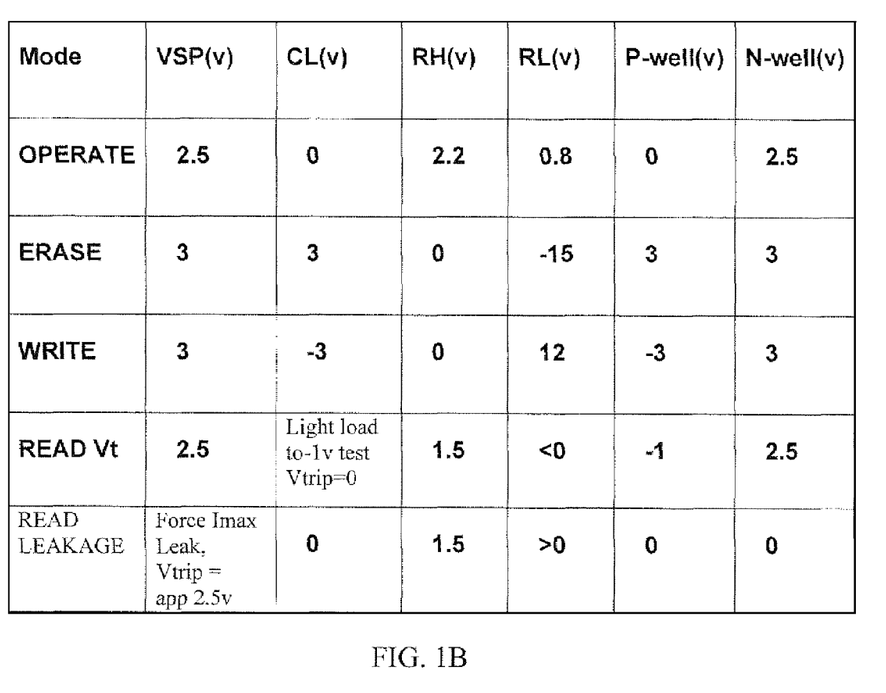
FIG. 1B is a table setting forth the operating voltages applied to the first embodiment of non-volatile memory cell as depicted in FIG. 1A according to the present invention.

FIG. 1B illustrates a table which sets forth the voltages applied to the non-volatile memory cell 100 for the normal operation, erase, write, read and leakage read of a NMOS flash EEPROM transistor, employed as the non-volatile memory element 106 in memory cell 100 in FIG. 1A. In each of these modes the p-type substrate or well in which the devices are disposed is at 0 volts. It will be appreciated by those of ordinary skill in the art that the given voltages are illustrative only, and the precise voltages depend upon the geometry of a particular non-volatile device and it implementation.

In the operating mode, first column line CL1 is at 2.5 volts, second column line CL2 is at 0 volts, first row line RH is at approximately 2.2 volts, second row line RL is at 0.8 volts, and the P-well 104 and the N-well 108 are at 0 volts and 2.5 volts, respectively.

In the erase mode, first column line CL1 is at 3 volts, second column line CL2 is at 3 volts, first row line RH is at 0 volts, second row line RL is at −15 volts, and the P-well 104 and the N-well 108 are at 3 volts and 3 volts, respectively.

In the write of floating gate transistor 106, first column line CL1 is at 3 volts, second column line CL2 is at −3 volts, first row line RH is at 0 volts, second row line RL is at 12 volts, and the P-well 104 and the N-well 108 are at −3 volts and 3 volts, respectively.

In the read mode when floating gate transistor 106 is erased, a read of the value at floating gate transistor 106 is performed when second column line CL2 is lightly loaded to a negative voltage of at least −1 volts and then tested to pull up to approximately 0 volts when the second row line RL is ramped up to less than 0 volts, the first column line CL1 is at 2.5 volts, second row line RH is at 1.5 volts, and the P-well 104 and the N-well 108 are at −1 volt and 2.5 volts, respectively.

In the read mode when floating gate transistor 106 is written, a read of the leakage at floating gate transistor 106 is performed when the first column line CL1 is forced to a predetermined acceptable leakage current, Imax leakage, and then tested to pull up to approximately 2.5 volts when the second row line RL is ramped up to greater than 0 volts. For these conditions, second column line CL2 is at 0 volts, first row line RH is at 1.5 volts, and the P-well 104 and the N-well 108 are at 0 volts and 0 volts, respectively.

It will be appreciated by those of ordinary skill in the art that during write and read operations unselected rows and columns will be inhibited to prevent write and read disturb of the values in the memory cells in the unselected rows and columns.

Those of ordinary skill in the art will appreciate that in the above description, the source and drain regions of the MOS and floating gate transistors have been specifically called out to aid in understanding the present invention, and that the source and drain regions may be identified as source/drain regions.

Those of ordinary skill in the art will further appreciated that columns and rows have also been described as such as an aid to understanding the present invention, and that the column and row designations indicate conductive lines that provide the appropriate signal transmission for the devices to which they are electrically coupled.

Figure 2A:
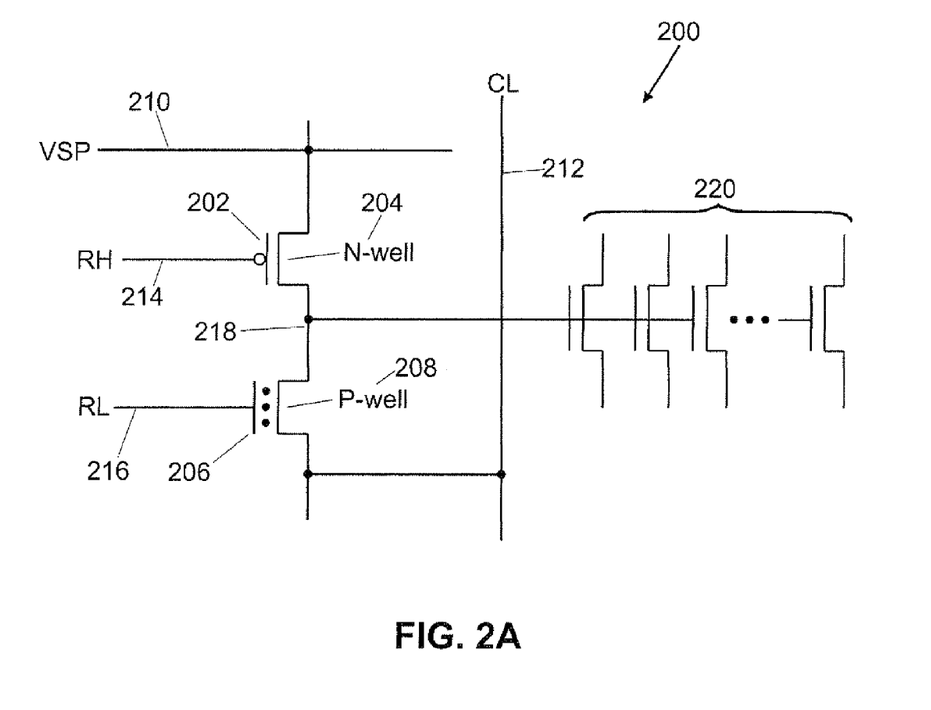
FIG. 2A is a schematic diagram of a second embodiment of non-volatile memory cell suitable for use according to the present invention.

In FIG. 2A, a second embodiment of a non-volatile memory cell 200 suitable for use according to the present invention is illustrated schematically. The memory cell 200 includes a pull-up device and a non-volatile pull-down device connected in a push-pull arrangement. The pull-up device in memory cell 200 is a p-channel MOS transistor 202, disposed in an N-well 204, and the non-volatile pull-down device in memory cell 200 is an n-channel floating gate silicon nanocrystal MOS transistor 206, disposed in a P-well 208.

In non-volatile memory cell 200, the source of p-channel MOS transistor 202 is electrically coupled to a first column line CL1 210, and the source of n-channel floating gate silicon nanocrystal MOS transistor 206 is electrically coupled to a second column line CL2 212. The gates of p-channel MOS transistor 202 and n-channel floating gate silicon nanocrystal MOS transistor 206 are electrically coupled to first and second row lines (RH and RL) 214 and 216, respectively. The drain of p-channel MOS transistor 202 is electrically coupled to the drain of n-channel floating gate silicon nanocrystal MOS transistor 206 to form a common node 218. A switch element in non-volatile memory cell 200, depicted as n-channel MOS transistor 220 has a gate coupled to common node 218. The output at common node 218 may otherwise be employed to drive a static device that programs the logic in the FPGA.

Figure 2B:
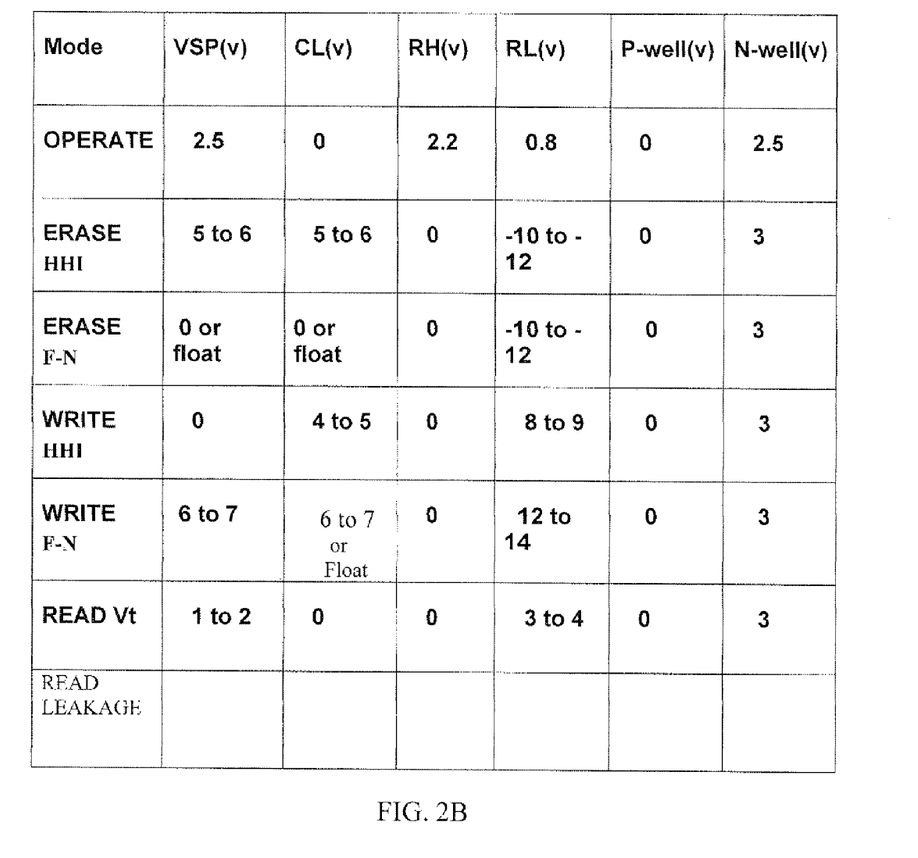
FIG. 2B is a table setting forth the operating voltages applied to the second embodiment of non-volatile memory cell as depicted in FIG. 2A according to the present invention.

FIG. 2B illustrates a table which sets forth the voltages applied to the non-volatile memory cell 200 for normal operation, erasure by either hot hole injection or by Fowler-Nordheim tunneling, writing by either hot hole injection or by Fowler-Nordheim tunneling, read and leakage read of a floating gate silicon nanocrystal MOS transistor, employed as the non-volatile memory cell 200 in FIG. 2A. In each of these modes the p-type substrate or well in which the devices are disposed is at 0 volts. It will be appreciated by those of ordinary skill in the art that the given voltages are illustrative only, and the precise voltages depend upon the geometry of a particular non-volatile device and its implementation.

In the operating mode, first column line CL1 is at 2.5 volts, second column line CL2 is at 0 volts, first row line RH is at approximately 2.2 volts, second row line RL is at 0.8 volts, and the P-well 104 and the N-well 108 are at 0 volts and 2.5 volts, respectively.

In the erase mode by hot hole injection, first column line CL1 is at about 5 volts to about 6 volts, second column line CL2 is at about 5 volts to about 6 volts, first row line RH is at 0 volts, second row line RL is at about −10 volts to about −12 volts, and the P-well 104 and the N-well 108 are at 0 volts and 3 volts, respectively.

In the erase mode by Fowler-Nordheim tunneling, first column line CL1 is at 0 volts or allowed to float, second column line CL2 is at 0 volts or allowed to float, first row line RH is at 0 volts, second row line RL is at about −10 volts to about −12 volts, and the P-well 104 and the N-well 108 are at 0 volts and 3 volts, respectively.

In the write mode by hot hole injection, to write above the source diffusion first column line CL1 is at 0 volts, second column line CL2 is at about 4 volts to about 5 volts, first row line RH is at 0 volts, second row line RL is at about 8 volts to about 9 volts, and the P-well 104 and the N-well 108 are at 0 volts and 3 volts, respectively.

In the write mode by Fowler-Nordheim tunneling, first column line CL1 is at about 6 volts to about 7 volts, second column line CL2 is at about 6 volts to about 7 volts or allowed to float, first row line RH is at 0 volts, second row line RL is at about 12 volts to about 14 volts, and the P-well 104 and the N-well 108 are at 0 volts and 3 volts, respectively.

In the read mode when n-channel floating gate silicon nanocrystal MOS transistor 206 is erased, a read of the value at n-channel floating gate silicon nanocrystal MOS transistor 206 is performed when the first column line CL1 is at about 1 volts to about 2 volts, second column line CL2 is at 0 volts, first row line RH is at 0 volts, second row line RL is at about 3 volts to about 4 volts, and the P-well 104 and the N-well 108 are at 0 volts and 3 volts, respectively.

In the read mode when floating gate transistor 206 is written, a read of the leakage at floating gate transistor 206 is performed when the first column line CL1 is forced to a predetermined acceptable leakage current, Imax leakage, and then tested to pull up to approximately 2.5 volts when the second row line RL is ramped up to greater than 0 volts. For these conditions, second column line CL2 is at 0 volts, first row line RH is at 1.5 volts, and the P-well 104 and the N-well 108 are at 0 volts and 0 volts, respectively.

It will be appreciated by those of ordinary skill in the art according to the present invention that other devices may be employed as the non-volatile memory elements in memory cells 100 and 200. A more complete description of the memory cells 100 and 200 and non-volatile memory elements may be found in United States patent application Ser. No. 11/152,018, filed Jun. 13, 2005 by inventors Fethi Dhaoui, John McCollum, and Frank Hawley, and Leslie Richard Wilkinson, assigned to the same assignee as the present invention, and hereby incorporated by reference.

Figure 3:
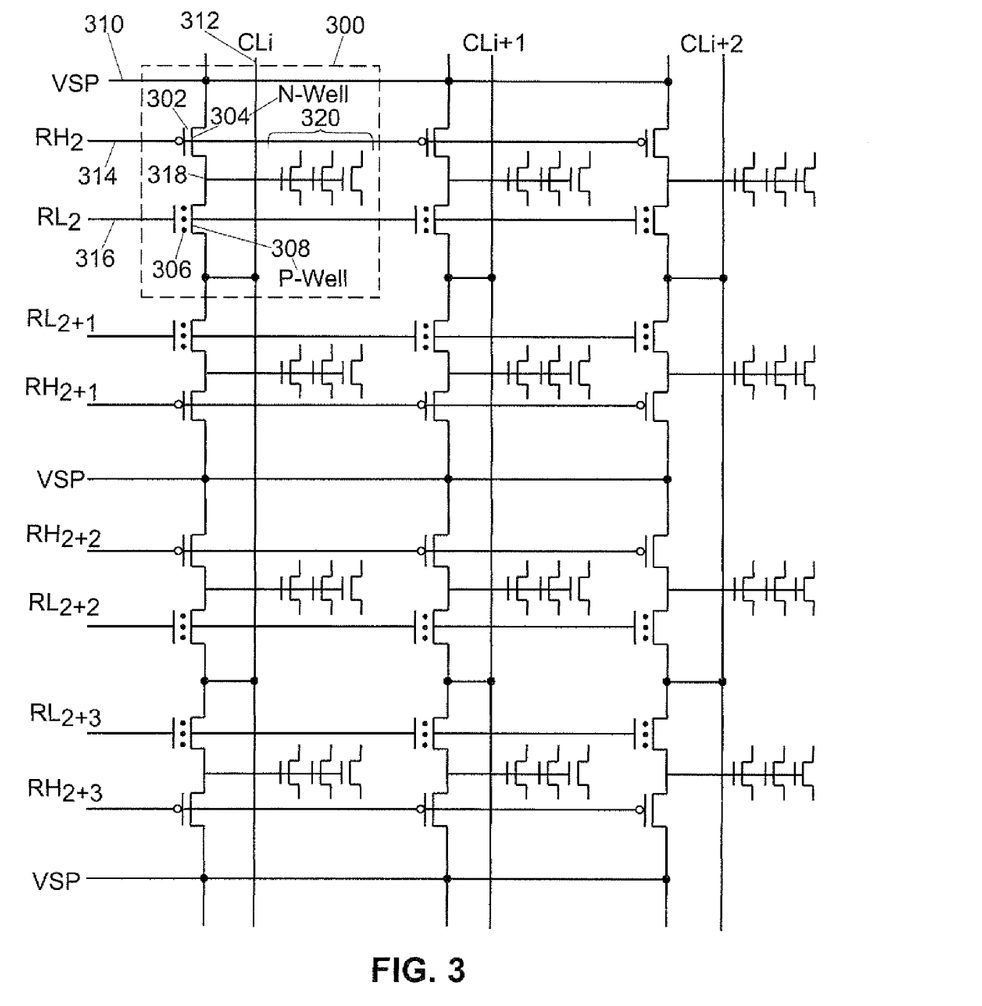
FIG. 3 is a schematic diagram of array of non-volatile memory cells suitable for use according to the present invention.

FIG. 3 illustrates a 3×4 array of non-volatile memory cells 300 depicted in FIG. 2A suitable for use according to the present invention. In each of the memory cells 300 a pull-up device and a non-volatile pull-down device are connected in a push-pull arrangement. The pull-up device in each memory cell 300 is a p-channel MOS transistor 302, disposed in an N-well 304, and the non-volatile element in each memory cell 300 is an n-channel floating gate silicon nanocrystal MOS transistor 306, disposed in a P-well 308. It should be readily appreciated that the non-volatile memory element employed in memory cell 300 could otherwise be a floating gate transistor as depicted and described with respect to FIGS. 1A and 1B according to the present invention.

In each non-volatile memory cell 300, the source of p-channel MOS transistor 302 is electrically coupled to a first column line CL1 310, and the source of n-channel floating gate silicon nanocrystal MOS transistor 306 is electrically coupled to a second column line CL2 312. The gates of p-channel MOS transistor 302 and n-channel floating gate silicon nanocrystal MOS transistor 306 are electrically coupled to first and second row lines (RH and RL) 314 and 316, respectively. The drain of p-channel MOS transistor 302 is electrically coupled to the drain of n-channel floating gate silicon nanocrystal MOS transistor 306 to form a common node 318. A switch element in non-volatile memory cell 300, depicted as n-channel MOS transistor 320 has a gate coupled to common node 318. The output at common node 318 may otherwise be employed to drive a static device that programs the logic in the FPGA.

Although in FIG. 3, the source of each p-channel MOS transistor 302 in a particular row is depicted as electrically coupled to a separate first column line CL1 310, it will be appreciated according to the present invention that alternatively each p-channel MOS transistor or some subset thereof in the array may have their sources coupled to a single global voltage source.

According to the present invention, a non-volatile memory cell array based FPGA may be tested without necessarily programming the non-volatile devices for each specific test pattern. In FIG. 3, the switches are normally controlled by programming or erasing the corresponding non-volatile devices to the desired state for the specific cell. According to the present invention, when all non-volatile devices are set to the same state so that the non-volatile devices behave similarly to an MOS transistor, charge may be stored temporarily on the common node 318 in each of the memory cells 300 to set the state of the corresponding switch devices 320. The charge may be stored on the common nodes 318 without the necessity of programming the non-volatile memory elements 306 for each specific test pattern.

When storing charge on the common nodes 318 in a memory cell array, the charge may be stored on either a single row in the array or multiple rows simultaneously. When multiple rows are stored simultaneously, the stored data in each of the rows will be the same. Otherwise, when data is stored in single rows or groups of rows sequentially, the data stored in each of the single rows or groups of rows need not be the same.

Figure 4:
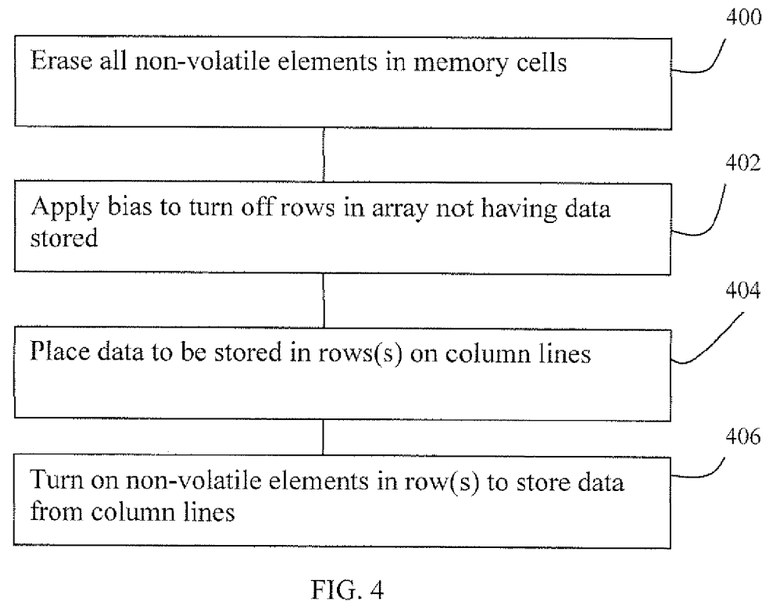
FIG. 4 is a flow diagram of a first embodiment of a method for storing data in the array depicted in FIG. 3 according to the present invention.

In FIG. 4, a flow diagram sets forth a first embodiment according to the present invention of a method for storing data in selected rows on the common nodes 318 depicted in FIG. 3. According to the present invention, when fewer than all of the rows required to implement a particular test pattern are selected, the situation is dynamic such that as the rows or groups of rows are being sequentially selected to store all the data required for a particular test pattern, the data may need to be refreshed until all of the required data is stored. Otherwise, according to the present invention, when all of the rows required to implement a particular test pattern are selected, the situation is static such that the data stored in the selected rows should not need to be refreshed.

At step 400, all of the non-volatile devices 306 in the memory cells 300 in the FPGA are set to the same state as either erased or programmed. Preferably, according to the present invention, the non-volatile devices 306 in the memory cells 300 should first be erased as described above with regard to FIGS. 2A and 2B. By setting all of the non-volatile devices 306 to the same state, the non-volatile devices 306 may be operated in a manner similar to an MOS transistor. It will be appreciated by those of ordinary skill in the art that the non-volatile devices 306 will be operated at different voltages than that of an MOS transistor to account for the charge storage or trapping portion of the non-volatile devices 306.

At step 402, for those rows that are not being written with data, a bias should be applied to the first and second row lines 314 and 316 in those rows to keep the devices turned off. It will be appreciated by those of ordinary skill in the art that a p-channel device is turned off by applying a positive voltage to its gate relative to its substrate and that an n-channel device is turned off by applying a negative voltage to its gate relative to its substrate. By turning off the devices in rows that are not being programmed, charge is being prevented from either leaking onto or off of the common nodes 318 in those particular rows.

At step 404, the values to be stored at the common nodes 318 in the memory cells 300 of the rows being selected for programming are placed on the second column lines CL2 312.

At step 406, a positive voltage pulse is then applied to second row lines RL 316 coupled to the gates of the non-volatile devices 306 sufficient to turn on the non-volatile devices 306 and thereby store the values placed on the second column lines CL2 312 on the common nodes 318 in the selected rows.

As described above for the dynamic situation when fewer than all of the required rows for a particular test pattern are being written, the subsequent rows to be written may be written in the manner described at steps 602-606.

Figure 5:
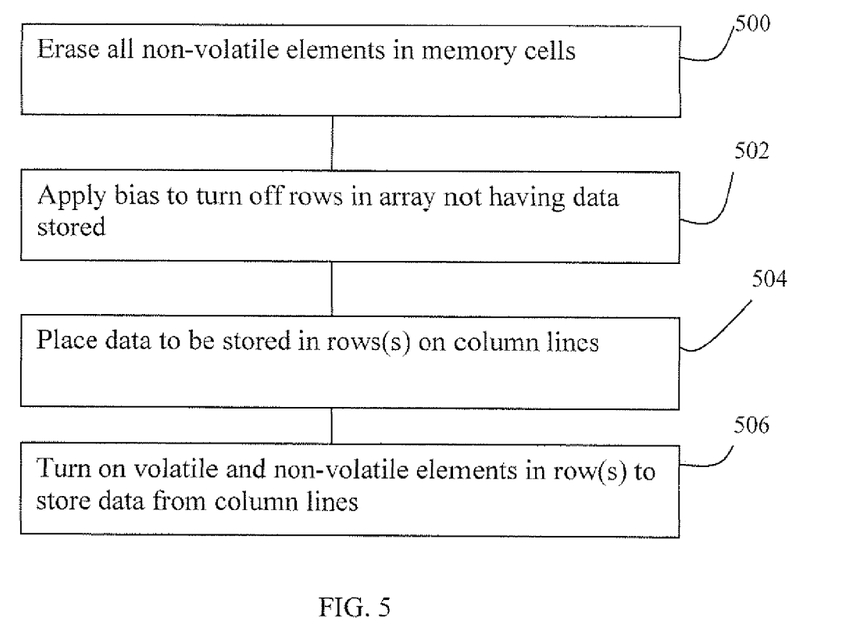
FIG. 5 is a flow diagram of a second embodiment of a method for storing data in the array depicted in FIG. 3 according to the present invention.

In FIG. 5, a flow diagram sets forth a second embodiment according to the present invention of a method for storing data in selected rows on the common nodes 318 depicted in FIG. 3. According to the present invention, when fewer than all of the rows required to implement a particular test pattern are selected, the situation is dynamic such that as the rows or groups of rows are being sequentially selected to store all the data required for a particular test pattern, the data may need to be refreshed until all of the required data is stored. Otherwise, according to the present invention, when all of the rows required to implement a particular test pattern are selected, the situation is static such that the data stored in the selected rows should not need to be refreshed.

At step 500, all of the non-volatile devices 306 in the memory cells 300 in the FPGA are set to the same state as either erased or programmed. Preferably, according to the present invention, the non-volatile devices 306 in the memory cells 300 should first be erased as described above with regard to FIGS. 2A and 2B. By setting all of the non-volatile devices 306 to the same state, the non-volatile devices 306 may be operated in a manner similar to an MOS transistor. It will be appreciated by those of ordinary skill in the art that the non-volatile devices 306 will be operated at different voltages than that of an MOS transistor to account for the charge storage or trapping portion of the non-volatile devices 306.

At step 502, for those rows that are not being written with data, a bias should be applied to the first and second row lines 314 and 316 in those rows to keep the devices turned off. It will be appreciated by those of ordinary skill in the art that a p-channel device is turned off by applying a positive voltage to its gate relative to its substrate and that an n-channel device is turned off by applying a negative voltage to its gate relative to its substrate. By turning off the devices in rows that are not being programmed, charge is being prevented from either leaking onto or off of the common nodes 318 in those particular rows.

At step 504, the values to be stored at the common nodes 318 in the memory cells 300 of the rows being selected for programming are placed on the second column lines CL2 312.

At step 506, a negative voltage pulse is then applied to the first row lines RH 314 coupled to the gates of the p-channel MOS transistors 302 in the selected rows sufficient to turn on the p-channel MOS transistors 302, and thereby supply a small pull-up current, while a positive voltage pulse is applied to the second row lines RL 316 coupled to the gates of the non-volatile devices 306 in the selected rows sufficient to turn on the non-volatile devices 306. By turning on the p-channel MOS transistors 302 to supply a small pull-up current and simultaneously turning on the non-volatile devices 306, the voltages provided on the second columns CL2 312 and the voltages needed to turn on the non-volatile devices 306 can be lower than the voltages provided on the second columns CL2 312 and the non-volatile devices 306 in the embodiment described with regard to FIG. 4.

As described above for the dynamic situation when fewer than all of the required rows for a particular test pattern are being written, the subsequent rows to be written may be written in the manner described at steps 502-506.

Figure 6:
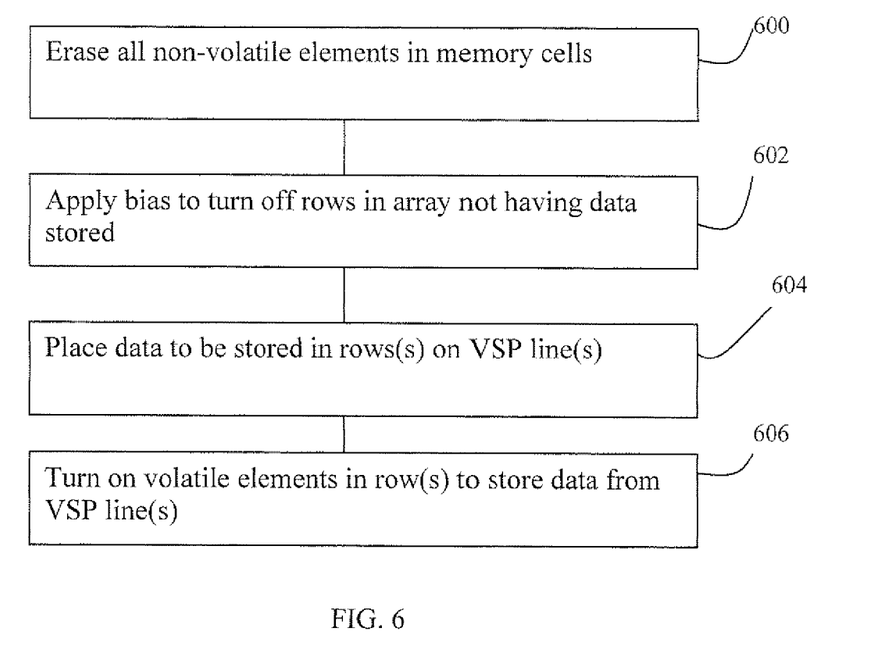
FIG. 6 is a flow diagram of a third embodiment of a method for storing data in the array depicted in FIG. 3 according to the present invention.

In FIG. 6, a flow diagram sets forth a third embodiment according to the present invention of a method for storing data in selected rows on the common nodes 318 depicted in FIG. 3. According to the present invention, when fewer than all of the rows required to implement a particular test pattern are selected, the situation is dynamic such that as the rows or groups of rows are being sequentially selected to store all the data required for a particular test pattern, the data may need to be refreshed until all of the required data is stored. Otherwise, according to the present invention, when all of the rows required to implement a particular test pattern are selected, the situation is static such that the data stored in the selected rows should not need to be refreshed.

At step 600, all of the non-volatile devices 306 in the memory cells 300 in the FPGA are set to the same state as either erased or programmed. Preferably, according to the present invention, the non-volatile devices 306 in the memory cells 300 should first be erased as described above with regard to FIGS. 2A and 2B. By setting all of the non-volatile devices 306 to the same state, the non-volatile devices 306 may be operated in a manner similar to an MOS transistor. It will be appreciated by those of ordinary skill in the art that the non-volatile devices 306 will be operated at different voltages than that of an MOS transistor to account for the charge storage or trapping portion of the non-volatile devices 306.

At step 602, for those rows that are not being written with data, a bias should be applied to the first and second row lines 314 and 316 in those rows to keep the devices turned off. It will be appreciated by those of ordinary skill in the art that a p-channel device is turned off by applying a positive voltage to its gate relative to its substrate and that an n-channel device is turned off by applying a negative voltage to its gate relative to its substrate. By turning off the devices in rows that are not being programmed, charge is being prevented from either leaking onto or off of the common nodes 318 in those particular rows.

At step 604, the values to be stored at the common nodes 318 in the memory cells 300 of the rows being selected for programming are placed on the first column lines CL1 310. As described above, when the first column lines CL1 310 are in fact a global line, the values to be stored on each of the common nodes 318 in the selected rows will be the same.

At step 606, a negative voltage pulse is then applied to the first row line RH 314 coupled to the gates of the p-channel MOS transistors 302 of the volatile elements 302 in the selected rows sufficient to turn on the p-channel MOS transistors 302, and thereby store the values placed on the first column lines CL1 310 on the common nodes 318 in the selected rows.

As described above for the dynamic situation when fewer than all of the required rows for a particular test pattern are being written, the subsequent rows to be written may be written in the manner described at steps 402-406.

Although it will be appreciated that the methods described above are specifically directed to an array embodiment in FIG. 3 wherein the non-volatile devices in the array are n-channel floating gate silicon nanocrystal MOS transistors 306, it should be further appreciated that other non-volatile devices, including the floating gate transistor described with respect to FIGS. 1A and 1B could be incorporated into an array and the methods described above applied to those arrays as well in keeping with the operations described above for a floating gate transistor.

Prior to testing the FPGA in the dynamic situation, the amount of leakage at each of the common nodes 318 should first be assessed to determine whether each of the common nodes 318 can hold enough charge for a period of time sufficient to test the FPGA. If any of the common nodes 318 in a row has excessive leakage, the row can be tagged to indicate that it must be refreshed more often than otherwise. Alternatively, the non-volatile memory elements 306 of that row may be programmed with the desired test values. If the non-volatile memory elements 306 in some row are programmed, the row should be tagged to indicate that the pull-up devices for that row should be turned on weakly.

When a row is tagged, its address is stored in a memory. This memory may be partitioned so that row addresses identifying rows needing to be refreshed more frequently may be in a first portion of the memory, row addresses identifying rows needing to have the non-volatile devices programmed may be in a second portion of the memory. Alternatively, separate memories may be provided. It should be appreciated by those of ordinary skill in the art that various implementations of memory schemes for identifying particular rows are within the scope of the invention, and the present invention is not to be limited to any particular memory scheme implementation.

It should also be appreciated that there may be certain other situations where it is beneficial to employ volatile storage as described above with regard to FIGS. 4, 5, and 6 according to the present invention for some of the rows in the memory array and non-volatile storage for other of the rows in the memory array. A non-exhaustive list includes additional flexibility in applying tests statically, context switching, debug or special test. As described above, a tag memory can be employed to partition the memory array into volatile and non-volatile portions on a row-by-row basis.

According to the present invention, refresh of any volatile data stored on the common nodes in the memory array is preferably from an external source. For example, when data is being stored in the memory array for testing, the data could be refreshed from an external test memory. Otherwise, when the memory array is being employed at least partially as volatile memory storage, the memory storage may either be on the FPGA or form an external memory source.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiments disclosed, but that the invention will include all embodiments falling within the scope of the appended claims.

What is claimed is:

1. A method for storing data on nodes in memory cells of a non-volatile memory cell array including steps of:
    setting non-volatile devices of the non-volatile memory cell array to a desired state;
    loading data onto column lines of the non-volatile memory cell array;
    biasing non-volatile devices in the memory cells of the non-volatile memory cell array to store data from said column lines on the nodes in the memory cells of the non-volatile memory cell array and;
    biasing pull-up devices and non-volatile devices in a first set of rows of the non-volatile memory cell array to an off state;
    wherein said step of biasing non-volatile devices in the memory cells of the non-volatile memory cell array is directed towards a second set of rows of the non-volatile memory cell array.

2. A method for storing data as in claim 1 wherein said step of setting non-volatile devices of the non-volatile memory cell array to a desired state includes erasing each of said non-volatile devices in the non-volatile memory cell array.

3. A method for storing data as in claim 1 further including the step of testing for the nodes in the memory cells of the non-volatile memory cell array that cannot store charge as desired.

4. A method for storing data as in claim 3 further including the step of storing the location of a row having a node that cannot store charge as desired as determined in said testing step.

5. A method for storing data as in claim 1 wherein said step of setting includes erasing each of said non-volatile devices in the non-volatile memory cell array.

6. A method for storing data as in claim 1 further including the step of refreshing said data from said column lines stored on the nodes in the memory cells of the non-volatile memory cell array as desired.

7. A method for storing data as in claim 1 further including the step of testing for the nodes in the memory cells of the non-volatile memory cell array that cannot store charge as desired.

8. A method for storing data as in claim 7 further including the step of storing the location of a row having a node that cannot store charge as desired as determined in said testing step.

9. A method for storing data on nodes in memory cells of a non-volatile memory cell array including steps of:
    setting non-volatile devices of the non-volatile memory cell array to a desired state;
    loading data onto column lines of the non-volatile memory cell array;
    biasing pull-up devices and non-volatile devices in the memory cells of the non-volatile memory cell array to store data from said column lines on the nodes in the memory cells of the non-volatile memory cell array and;
    biasing pull-up devices and non-volatile devices in a first set of rows of the non-volatile memory cell array to an off state; and
    wherein said step of biasing pull-up devices and non-volatile devices in the memory cells of the non-volatile memory cell array is directed towards a second set of rows of the non-volatile memory cell array.

10. A method for storing data as in claim 9 wherein said step of setting includes erasing each of said non-volatile devices in the non-volatile memory cell array.

11. A method for storing data as in claim 9 further including the step of testing for the nodes in the memory cells of the non-volatile memory cell array that cannot store charge as desired.

12. A method for storing data as in claim 11 further including the step of storing the location of a row having a node that cannot store charge as desired as determined in said testing step.

13. A method for storing data as in claim 9 wherein said step of setting includes erasing each of said non-volatile devices in the non-volatile memory cell array.

14. A method for storing data as in claim 9 further including the step of refreshing said data from said column lines stored on the nodes in the memory cells of the non-volatile memory cell array as desired.

15. A method for storing data as in claim 9 further including the step of testing for the nodes in the memory cells of the non-volatile memory cell array that cannot store charge as desired.

16. A method for storing data as in claim 15 further including the step of storing the location of a row having a node that cannot store charge as desired as determined in said testing step.

17. A method for storing data on nodes in memory cells of a non-volatile memory cell array including steps of:
    setting non-volatile devices of the non-volatile memory cell array to a desired state;

loading data onto column lines of the non-volatile memory cell array; and biasing pull-up devices in the memory cells of the non-volatile memory cell array to store data from said column lines on the nodes in the memory cells of the non-volatile memory cell array and;

biasing pull-up devices and non-volatile devices in a first set of rows of the non-volatile memory cell array to an off state;

wherein said step of biasing pull-up devices in the memory cells of the non-volatile memory cell array is directed towards a second set of rows of the non-volatile memory cell array.

18. A method for storing data on nodes in memory cells of a non-volatile memory cell array as in claim 17 wherein said column lines are a single global column line.

19. A method for storing data as in claim 17 wherein said step of setting includes erasing each of said non-volatile devices in the non-volatile memory cell array.

20. A method for storing data as in claim 17 further including the step of testing for the nodes in the memory cells of the non-volatile memory cell array that cannot store charge as desired.

21. A method for storing data as in claim 20 further including the step of storing the location of a row having a node that cannot store charge as desired as determined in said testing step.

22. A method for storing data on nodes in memory cells of a non-volatile memory cell array as in claim 17 wherein said column lines are a single global column line.

23. A method for storing data as in claim 17 wherein said step of setting includes erasing each of said non-volatile devices in the non-volatile memory cell array.

24. A method for storing data as in claim 17 further including the step of refreshing said data from said column lines stored on the nodes in the memory cells of the non-volatile memory cell array as desired.

25. A method for storing data on nodes in memory cells of a non-volatile memory cell array as in claim 17 wherein said column lines are a single global column line.

26. A method for storing data as in claim 17 further including the step of testing for the nodes in the memory cells of the non-volatile memory cell array that cannot store charge as desired.

27. A method for storing data as in claim 17 further including the step of storing the location of a row having a node that cannot store charge as desired as determined in said testing step.

* * * * *